United States Patent [19]

Meal

[11] 4,255,779
[45] Mar. 10, 1981

[54] PACKAGE MACHINE INSERTABLE ROLLED METALLIZED FILM CAPACITOR

[75] Inventor: John R. Meal, Naperville, Ill.

[73] Assignee: Western Electric Company, Inc., New York, N.Y.

[21] Appl. No.: 974,209

[22] Filed: Dec. 28, 1978

[51] Int. Cl.³ .............................................. H01G 1/14
[52] U.S. Cl. .............................. 361/308; 174/52 PE; 361/304; 361/309
[58] Field of Search ............... 361/306, 308, 309, 404, 361/304; 174/52 PE

[56] References Cited

U.S. PATENT DOCUMENTS

| 1,900,352 | 3/1933 | Lewis . | |
|---|---|---|---|
| 2,673,972 | 3/1954 | Minnium . | |
| 2,908,886 | 10/1959 | Frekko | 361/306 X |
| 3,060,356 | 10/1962 | Beyer . | |
| 3,086,149 | 4/1963 | Baron | 361/306 X |
| 3,117,297 | 1/1964 | De Gier | 361/306 X |
| 3,222,450 | 12/1965 | Lee | 174/52 PE |
| 3,721,747 | 3/1973 | Renskers | 174/52 PE |
| 3,772,079 | 11/1973 | Louzon . | |
| 3,806,766 | 4/1974 | Fanning . | |
| 3,831,265 | 8/1974 | Louzon . | |
| 3,838,316 | 9/1974 | Brown . | |

OTHER PUBLICATIONS

"2-Lead Dip Ceramic Cap by AVX" in Electronic News 10/4/76, p. 48.

Primary Examiner—Elliot A. Goldberg
Attorney, Agent, or Firm—R. P. Miller

[57] ABSTRACT

A small rolled metallized film capacitor is completely encapsulated within a thin walled box with bonded terminals projecting from an open end of the box. The terminals are formed with offset shoulder sections resting on and extending laterally beyond the opposed walls of the box. The terminals are further shaped and formed to provide narrow insertion sections that project from the shoulder sections in generally normal but slightly diverted directions.

7 Claims, 9 Drawing Figures

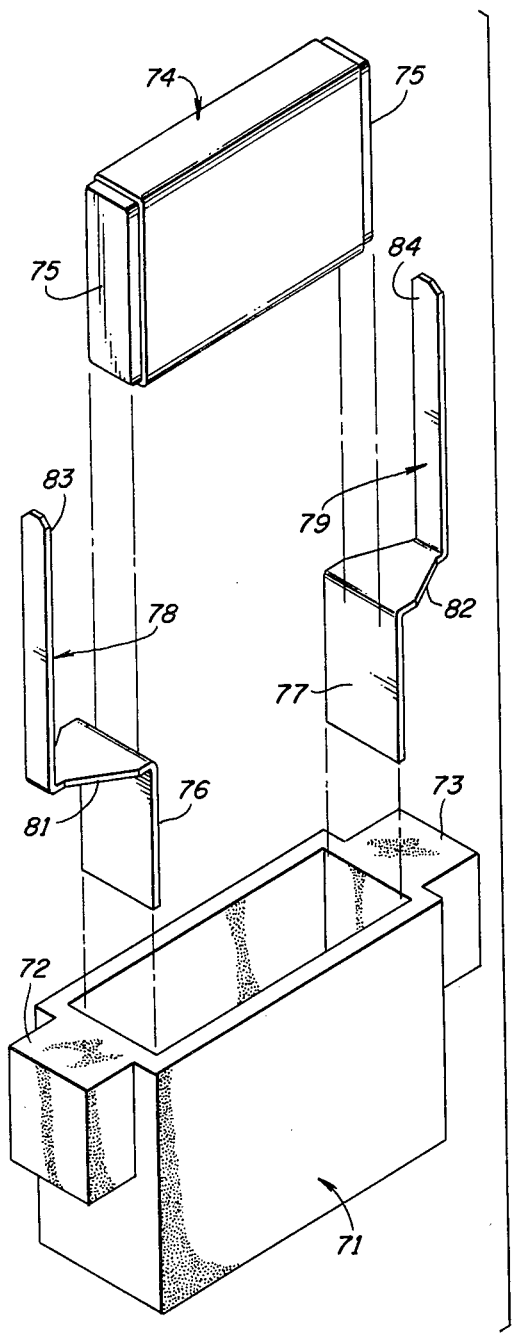
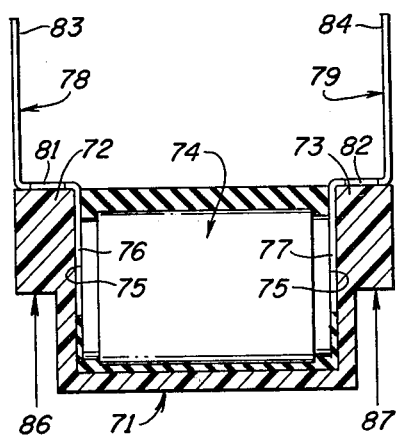
FIG. 6
FIG. 7

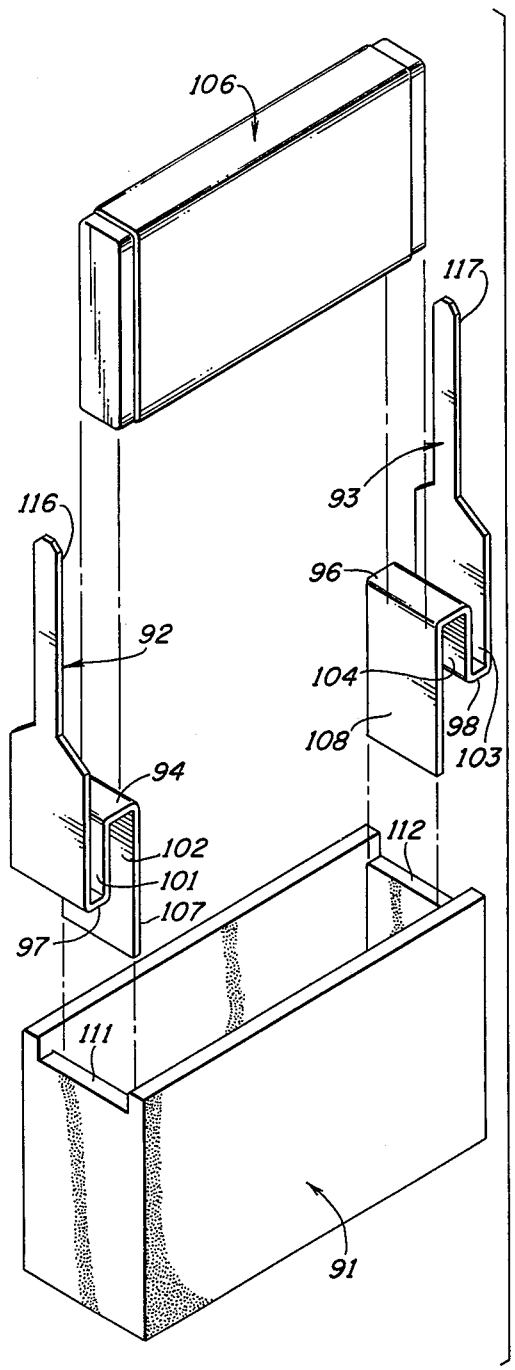
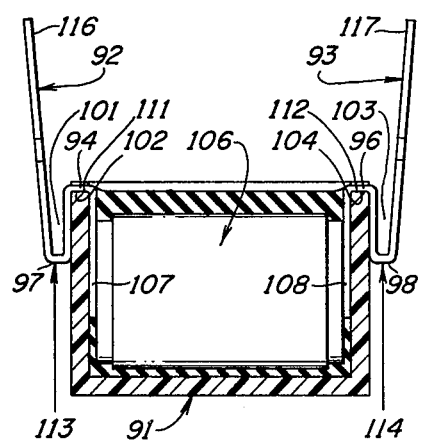
FIG. 8
FIG. 9

PACKAGE MACHINE INSERTABLE ROLLED METALLIZED FILM CAPACITOR

FIELD OF THE INVENTION

This invention relates to rolled metallized film capacitor assemblies that are readily machine insertable in a circuit board and, more particularly, to the construction of packaging boxes and terminal configurations which facilitate machine insertion of the packaged capacitor assemblies.

BACKGROUND OF THE INVENTION

With the advent of miniature integrated and hybrid circuit designs there are continuing needs for small packaged passive electrical devices which are readily machine insertable in circuit boards or other support and mounting structures. Many minute active and passive devices have been packaged in small plastic cases known as DIP's (Dual In-Line Packages). Among the devices that have been DIP packaged for machine insertion are small ceramic capacitors. Though ceramic capacitors are suitable for many types of circuit constructions, such capacitors do possess certain detrimental characteristics. More specifically, ceramic capacitors are temperature sensitive, non-self healing, subject to capacitance derogation over a period of time, and possess the property of failing upon break down.

Rolled metallized film capacitors on the other hand are not subject to the detrimental characteristics inherent in ceramic capacitors. One of the problems confronted in the design of machine insertable rolled metallized film capacitors is the design of the terminals which permit packaging in such a fashion as to produce a device wherein the forces resulting from the machine insertion to the bond sites of the terminals are minimized. Other problem areas in the design of packaged rolled metallized film capacitors resides in the package that is moisture proof. Further, the terminal configuration must be such that upon assembly of the packaged capacitor on a circuit board, the electrical contacts to the circuit board must be confined to specific designated contact sites.

Numerous expedients have been devised to package and terminate rolled metallized film capacitors to insure moisture sealing. In these designs many terminal configurations have evolved to insure good electrical connection into electrical circuits. One containerized, rolled tin foil-insulating, ribbon-type of capacitor is shown in U.S. Pat. No. 1,900,352 to R. O. Lewis. In this patent, cupped solder-filled terminals are secured to the ends of the metallic ribbons and the terminals have offset sections which extend toward each other and rest on the rolled capacitor blank. The offset sections of the terminals run into projecting wire connection sections which extend through an insulating strip which forms the top of a wax filled container for receiving the capacitor blank.

Other examples of packaged rolled film capacitors may be found in U.S. Pat. Nos. 3,772,079 to T. J. Louzon; 3,806,766 to W. J. Fanning; 3,831,265 to T. J. Louzon et al. and 3,838,316 to D. R. Brown et al. In general, these patents relate to various expedients for packaging metallized film rolled capacitors having projecting wire-like leads that are manually insertable in conductive lined or plain holes formed in printed circuit boards.

In considering the prior art, attention is directed to the DIP packaged ceramic capacitors wherein a ceramic capacitor is placed in a mold and insulating plastic is molded about the capacitor. In this construction, terminating leads extend laterally through the sides of the molded case and then are bent to provide shoulders and normally extending electrical connection sections. Machine inserting tools have been devised for engaging the molded ceramic capacitor package and forcing the package toward a circuit board while the terminal shoulders ride in guide slots to insert the normally extending lead sections into holes formed in a circuit board. An example of this type of capacitor is sold under the name of Dip Guard by the AVX Ceramics Corporation of Myrtle Beach, S.C.

SUMMARY OF THE INVENTION

The invention contemplates, among other things, a capacitor assembly wherein a small, rolled metallized film capacitor is completely encapsulated within a thin-walled plastic box. Terminals provided with offset shoulders that rest on and extend beyond the opposed edges of the box are heat fused at first ends to the rolled metallized film capacitor, while the other ends extend in generally normal, but slightly diverted, directions to the open end of the box.

More particularly, a number of terminal configurations are contemplated for small boxed, rolled metallized film capacitors which are easily machine inserted in printed circuit boards and the like and which insure that the insertion forces are not directly applied to the bond sites between the terminals and heat fusible end electrodes secured to the ends of the rolled film capacitor. In one configuration, offset sections formed in the terminals rest on shoulder blocks formed on the ends of the box; while in another configuration, the terminals are bent into laterally extending S-configurations to provide a pair of shoulders. In both of these configurations the insertion forces are applied to the shoulders, or the shoulders are used to guide the box capacitor during assembly onto a circuit board.

The invention also contemplates recessing opposed ends of the box to seat the laterally projected terminal section below the level of the open end edges of the box. When the box capacitor is assembled on a circuit board, this construction insures that the laterally projecting terminal sections do not engage conductive elements or paths on the circuit board. In other words, the connection of the terminals is confined to precisely designated contact sites such as contact areas formed in and about through-holes in the circuit board.

BRIEF DESCRIPTION OF THE DRAWING

Other features and advantages of the present invention will be apparent upon consideration of the following detailed specification and the drawings wherein:

FIG. 6 is an exploded isometric view of another embodiment of a machine insertable boxed metallized film capacitor having structural features for relieving insertion forces on the terminals during assembly in a printed circuit board;

FIG. 7 is a cross-sectional view of the assembled and encapsulated rolled metallized film capacitor shown in FIG. 6;

FIG. 8 is an exploded isometric view of a further embodiment of a machine insertable rolled capacitor with a terminal configuration for dissipating the insertion forces during assembly in a printed circuit board, and FIG. 9 is a cross-sectional view of the assembly and encapsulated rolled metallized film capacitor shown in FIG. 8.

Referring to FIG. 1, there is shown a capacitor blank 10 constructed of two strips of metallized polyester films wound together with the metallized surface of each strip engaging the non-metallized surface of the other strip. The wound strips are flattened into a substantially rectangular package and provided with end electrodes or terminal blocks 11 and 12 of a heat fusible material. The terminal blocks may be 0.015" thick and composed of a deposit of zinc followed by a deposit of an alloy of 70% tin and 30% zinc when the metallized films are coated with aluminum. With a zinc metallization of the strips, a similar composition may be used for the terminal blocks or other solders compatible and fusible to the zinc may be used. These electrodes are heat fused or bonded to the metallized coatings on the wound strip and to a pair of blade-like sections 13 and 14 forming sections of a pair of terminals generally designated by the reference numerals 16 and 17. The terminals may be constructed of a tinned phosphor bronze material.

Figure 1:
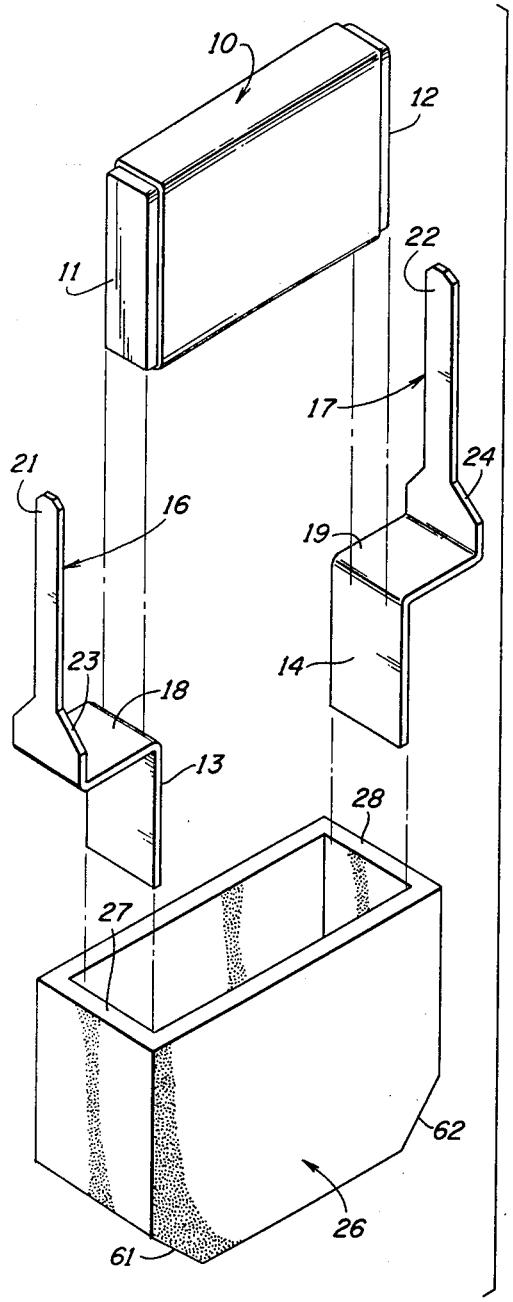
FIG. 1 is an exploded, isometric view of components of a boxed metallized film capacitor embodying certain principles of the present invention.

It is contemplated that the capacitor 10 be of a relatively small size; that is, that its height and width be approximately ¼" and its thickness be approximately 1/10". A method of constructing such a capacitor is more fully described in application Ser. No. 974,182 filed on even date herewith in the names of W. J. Fanning and O. T. Masopust, Jr. and entitled "Metallized Film Capacitor and Method of Manufacture".

The terminals 16 and 17 are further fabricated in offset fashion to provide a pair of laterally extending wide shoulder sections 18 and 19 which join the blade sections 13 and 14. The offset bends imparted to the terminals provide a pair of upwardly extending narrow insertion sections 21 and 22 which are joined to the shoulder sections by tapered sections 23 and 24.

Figure 2:
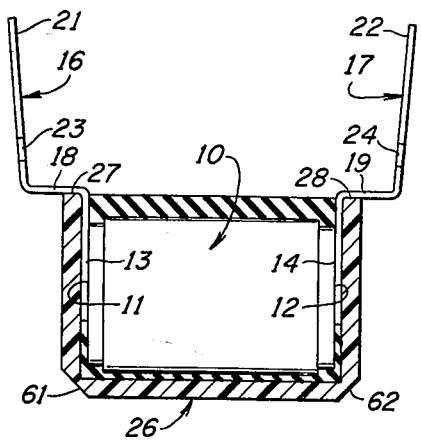
FIG. 2 is a cross-sectional view of the assembled and encapsulated rolled metallized film capacitor shown in FIG. 1.

With the terminals 16 and 17 fused to the electrodes 11 and 12, the assembled capacitor is inserted in a thin-walled plastic box 26 which may be constructed of polybulytene terephthalate or polyphenylene sulfide. The shoulders 18 and 19 of the terminals rest on opposed edges 27 and 28 of the box 26, and the blade-like sections 13 and 14 rest closely adjacent to the opposed narrow walls of the box 26. The offset construction of the terminals with the shoulders 18 and 19 insure that the lower portion of the capacitor 10 is slightly spaced from the bottom of the box 26. Following insertion of a capacitor into the box 26, a potting compound, such as bisphenol A type epoxy is flowed into the box to completely surround the capacitor 10 to provide a moisture seal. The complete encapsulation of the capacitor within the box is best shown in FIG. 2.

Figure 3:
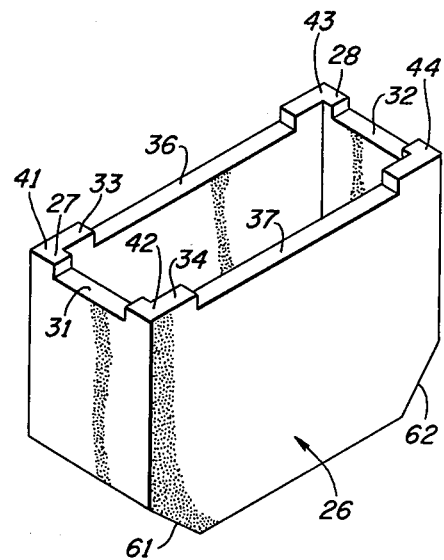
FIG. 3 is an isometric showing of an alternative construction of a box for receiving a rolled metallized film capacitor.

An alternate construction of the box is shown in FIG. 3, wherein the opposed edges 27 and 28 are provided with recesses 31 and 32 of a depth slightly greater than the thicknesses of the shoulders 18 and 19. Again, it is contemplated that the terminal be formed so that the shoulders 18 and 19 rest on the bottoms of the end wall recesses 31 and 32 to position the capacitor body 10 with a slight amount of clearance with respect to the bottom of the box 26.

A further modification of this box may be made by recessing the opposed long edges 33 and 34 to provide a pair of cut-outs 36 and 37 which together with the recesses 31 and 32 form a group of four standoffs generally designated 41, 42, 43 and 44 at the respective four corners of the box. With such a construction the insertion of a box capacitor into a circuit board will insure that the shoulders 18 and 19 do not contact the surface of the board so as to establish an electrical contact with any circuit path or conductor element that might be located on the engaged surface of the board. This construction insures that the electrical contact to the elements on the circuit board will be confined to those elements engaged by the narrow sections 21 and 22 of the terminals.

Figure 5:
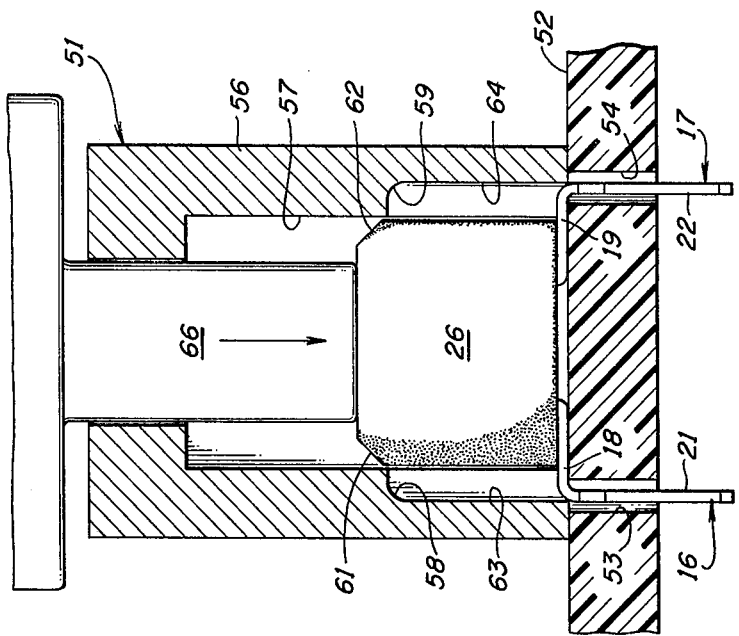
FIGS. 4 and 5 are partial sectional views of an insertion tool in two stages of operation during insertion of a rolled metallized film capacitor in a printed circuit board.
Figure 4:
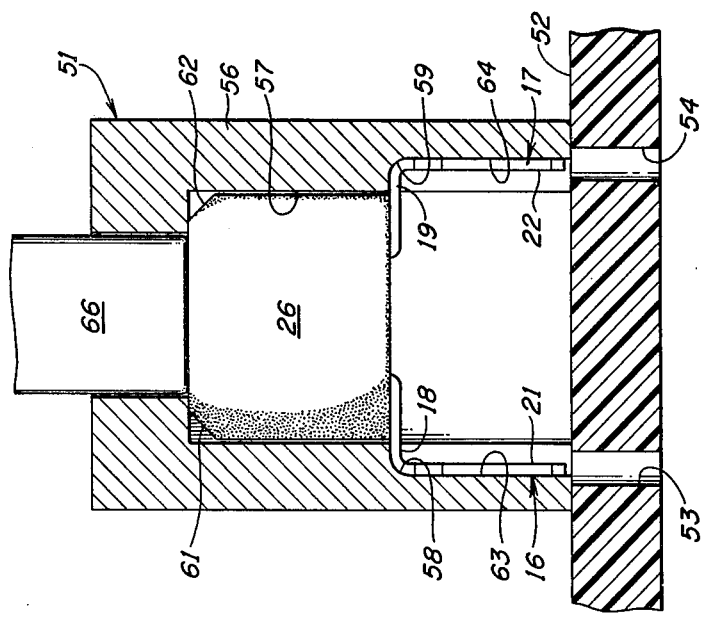

For a further consideration of an assembly of a box capacitor to a circuit board, attention is directed to FIGS. 4 and 5 wherein there is shown a tool 51 for assembling a box capacitor on a printed circuit board 52 having through holes 53 and 54. The tool 51 includes a head 56 with a recess 57 of such size as to receive the box 26 with a small amount of clearance between the side walls of the box and the walls of the recess 57. The recess 57 is formed with curved sections 58 and 59 to accommodate the offset curved portions of the shoulders 18 and 19 of the terminals. It will be noted that the box 26 is provided with beveled corners 61 and 62 which facilitate the loading and seating of the box 26 within the recess 57.

Further, it will be noted that the insertion sections 21 and 22 of the terminals are diverted slightly away from each other; as an example, 5° from normal. The diverted insertion sections 21 and 22 results in a spring biasing action of these sections against inner walls of a pair of guide slots 63 and 64 formed at the opposed walls of the recessed tool head 51. This spring action provides a force for holding the loaded boxed capacitor in the tool.

The head 51 may be slotted to receive a slide pusher 66 which is advanced to move the boxed capacitor and insert the terminal sections 21 and 22 in and through the holes 53 and 54. The extending portions of the terminal sections 21 and 22 may be crimped and/or soldered to circuit contact elements formed on the underside of the board.

As seen in FIG. 5, when the capacitor has been assembled on the printed circuit board, the wide, laterally extending sections 18 and 19 rest on the top of the board. In the situation where the box 26 shown in FIG. 3 is utilized, the laterally extending wide sections of the terminals 18 and 19 are seated in the recesses 31 and 32 so that these sections of the terminals do not contact the board. In this instance, the board is engaged by the extending top edges of the box 26 or the standoff corners 41, 42, 43 and 44. This arrangement insures that no circuit elements on the top surface of the board are engaged or short circuited by the terminal sections 18 and 19. Often in the construction of printed circuit boards conductive debris or slivers exit on the surface of the board. If these conductive extraneous conductor particles are engaged, there are possibilities of short circuits. With the recessed edge box construction, the possibilities of extraneous short circuits are eliminated.

Attention is directed to FIGS. 6 and 7, wherein there is shown a modified box 71 having a pair of laterally extending support blocks 72 and 73 which projects from the opposed outside walls of the box. A capacitor blank 74 is secured through heat fusible electrodes 75 to wide sections 76 and 77 of terminals 78 and 79. These terminals have laterally extending tapered sections 81 and 82 which rest on the top surfaces of the blocks 72 and 73 as shown in FIG. 7. Again, the terminals 78 and 79 are provided with narrow insertion sections 83 and 84 for passage through holes formed in a circuit board. In this instance, the provision of the support blocks 72 and 73 provides a means for application of insertion forces by a pair of insertion blades in the directions indicated by the arrows 86 and 87. The main brunt of the insertion forces are to the blocks 72 and 73 rather than directly to the terminals, thus, relieving forces that might otherwise disrupt the bond between the terminals and the capacitor blank. If an insertion tool, such as shown in FIGS. 4 and 5, is used, the blocks 72 and 73 act as guides riding in guide slot 63 and 64 to precisely assemble the boxed capacitor on the circuit board.

The box shown in FIGS. 6 and 7 may be further modified by providing recessed in the opposed edge walls and the blocks 72 and 73 to receive the laterally extending sections 81 and 82 of the terminals. Such a construction eliminates any possibility of the laterally extending sections 81 and 82 shorting out conductive elements formed on the top surface of a circuit board.

Referring to FIGS. 8 and 9 for a consideration of a further modification of the invention, there is shown a box 91 similar to the box shown in FIG. 3. In this instance, a pair of terminals 92 and 93 are each shaped to form a section that is doubled back upon itself to provide a first pair of laterally extending shoulders 94 and 96, and a second pair of laterally extending shoulders 97 and 98. The shaping of the shoulders forms the terminal with S-shaped configurations to form bights 101, 102, 103 and 104. A capacitor blank 106 is secured to a pair of wide sections 107 and 108 of the terminals 92 and 93. The capacitor is inserted in the box 91 so that the end walls are received in bights 102 and 104. The bights 102 and 104 may be slightly narrower than the thicknesses of the end walls to provide a spring clip action to hold the capacitor in place during encapsulation. The box may be provided with recesses 111 and 112 to receive the shoulders 94 and 96. The recesses are deep enough so that the tops of the shoulders are positioned below the level of the tops of the side edges of the rectangular-shaped box 91.

As shown in FIG. 9, the shoulders 97 and 98 project beyond the box to receive insertion forces depicted by the arrows 113 and 114. These insertion forces are directly applied to a pair of insertion sections 116 and 117 of the terminals. The S-shaped configurations of the terminals relieves the application of the insertion forces from the heat fused bonds between the capacitor and the terminals. Again, the terminal insertion sections 116 and 117 are diverted from normal so that the terminals exert a spring force on the guideways of an insertion tool of the type shown in FIGS. 4 and 5.

What is claimed is:

1. A capacitor assembly, which comprises:

a box formed of dielectric material and having an open end;

a pair of terminals configured to have (1) blade-like wide sections extending into and laying along opposed walls of the box; (2) laterally extending horizontal wide sections resting on the edges of said opposed walls to form shoulders which support the terminals with the ends thereof spaced from the bottom of the box, and having a flat section extending horizontally for a distance beyond said walls, and (3) narrow sections extending from the laterally extending wide sections in generally normal directions away from the open end of the box and extending beyond the said opposed walls of the box; and a rolled metallized film capacitor blank positioned within said box and having a pair of heat fusible termination blocks bonded to the ends of the blank and to the wide sections of the terminals extending into said box to support the capacitor with a clearance between the capacitor and the bottom of the box.

2. A capacitor assembly, as defined in claim 1, wherein the edges of said opposed walls are recessed by an amount greater than the thickness of the laterally extending wide sections of the leads so that the tops of the leads are below the level of the edges of the open end of the box.

3. A capacitor assembly, as defined in claim 1, which comprises:

a group of standoffs projecting from the corners of the open end of the box a distance greater than the thicknesses of said laterally extending sections of the leads.

4. A capacitor assembly, as defined in claim 1, which includes:

a pair of blocks of dielectric material projecting from the outer sides of said opposed walls for engaging the wide sections of the terminals extending beyond said opposed walls.

5. A capacitor assembly as defined in claim 4, wherein said wide sections of the laterally extending sections are tapered from the blade-like sections.

6. A capacitor assembly, as defined in claim 1, wherein said laterally extending wide sections are configured to bend down along said opposed walls, outwardly from said opposed walls, and then upwardly in spaced relations to said opposed walls to form two pairs of bights, the first of each of said pairs of bights being narrower than the thickness of the wall to provide a clip to secure the terminal to the associated wall, and the second of each of said pair of bights shaping a portion of said laterally extending section into a shoulder.

7. A boxed rolled metallized film capacitor, which comprises:

a box constructed of dielectric material having an open end;

a rolled metallized film capacitor blank having a pair of end electrodes of heat fusible material positioned within said box;

a pair of terminals bonded to said heat fusible end electrodes, said terminals interposed between the end electrodes and resting adjacent to opposed walls of said box, said terminals projecting through said open end with laterally extending shoulder sections resting on the tops of said opposed walls to support the metallized film capacitor in a position spaced from the bottom of the box and having sections that laterally extend a distance beyond said walls and which join extending sections that project outwardly from said open end of said box in generally normal directions but diverging slightly away from each other beyond said opposed walls of said box; and an encapsulant completely embedding the capacitor blank within said box.

* * * * *